United States Patent
Potters et al.

(10) Patent No.: US 6,320,252 B1
(45) Date of Patent: Nov. 20, 2001

(54) PC

(75) Inventors: Paul Johannes Marinus Potters, Eindhoven; Sergio Margini, Nuenen; Cornelis Gualtherus J. van den Aker, Nieuwkuijk; Antonius H. Johanna Gerrits, Beek en Donk, all of (NL)

(73) Assignee: Berg Technology, Inc., Reno, NV (US)

( * ) Notice: Subject to any disclaimer, the term of this patent is extended or adjusted under 35 U.S.C. 154(b) by 0 days.

(21) Appl. No.: 09/155,744

(22) PCT Filed: Apr. 4, 1997

(86) PCT No.: PCT/US97/05668

§ 371 Date: Oct. 5, 1998

§ 102(e) Date: Oct. 5, 1998

(87) PCT Pub. No.: WO97/38443

PCT Pub. Date: Oct. 16, 1997

Related U.S. Application Data
(60) Provisional application No. 60/014,946, filed on Apr. 5, 1996, and provisional application No. 60/015,146, filed on Apr. 5, 1996.

(51) Int. Cl.[7] .............................. H01L 23/02; H05K 1/14; H05K 7/14
(52) U.S. Cl. .......................... 257/679; 361/737; 361/799; 361/800; 361/807; 361/816; 361/829; 361/752; 361/753; 361/818
(58) Field of Search ............................. 257/679; 361/737, 361/741, 799, 800, 807, 816, 829, 752, 753, 818; 235/488, 492

(56) References Cited

U.S. PATENT DOCUMENTS

| | | | |
|---|---|---|---|
| Re. 36,540 | * 2/2000 | Farquhar et al. | 156/73.1 |
| 5,330,360 | * 7/1994 | Marsh et al. | 235/492 |
| 5,339,222 | * 8/1994 | Simmons et al. | 361/818 |
| 5,476,387 | * 12/1995 | Ramey et al. | 361/737 |
| 5,477,426 | 12/1995 | Bethurum | 361/737 |
| 5,493,477 | * 2/1996 | Hirai | 361/737 |
| 5,529,503 | * 6/1996 | Kerklaan | 361/737 |
| 5,548,483 | * 8/1996 | Feldman | 361/737 |
| 5,563,770 | 10/1996 | Bethurum | 361/737 |
| 5,687,064 | * 11/1997 | Nichols | 361/752 |
| 5,689,405 | 11/1997 | Bethurum | 361/737 |
| 5,754,404 | 5/1998 | Biermann et al. | 361/737 |
| 5,768,110 | * 6/1998 | Frommer et al. | 361/755 |
| 5,833,473 | 11/1998 | Betker et al. | 439/76.1 |
| 5,984,731 | 11/1999 | Laity | 439/676 |
| 6,058,018 | * 5/2000 | Gerrits et al. | 361/737 |
| 6,116,962 | 9/2000 | Laity | 439/676 |

\* cited by examiner

Primary Examiner—Jhihan B Clark
(74) Attorney, Agent, or Firm—Steven M. Reiss; M. Richard Page

(57) ABSTRACT

In one version, a PC card has a printed circuit board assembly (11) that is interposed between card shields (5,6). This PC card is frameless. In another version, a PC card has: card shields (103,104); a printed circuit board assembly (110) interposed between the card shields; and two interposing side frames (105, 105').

21 Claims, 11 Drawing Sheets

_PC_

This application claims the benefit of Provisional Application Nos. 60/014946 and 60/015146, both filed on Apr. 5, 1996.

BACKGROUND OF THE INVENTION

1. Field of the Invention

The present invention relates to electrical connectors and more particularly to memory cards.

2. Brief Description of Prior Developments

The Personal Computer Manufacturer Card International Association (PCMCIA) has established standards for type I, type II and type III memory cards.

Various arrangements have been suggested for fixing the upper shield to the cover shield in type II PCMCIA cards, for example, by press-fit or by gluing. Particularly with the press-fit method, difficulties may result in forming thin walled cavities in die cast materials to co-operate with the press-fit members. Consequently, it may be difficult to maintain sufficient rigidity in the structure to withstand flexing, bending and tension forces which would be expected to be placed on it in the course of ordinary use. There is, therefore, a need for a PCMCIA type II memory card which avoids the above mentioned difficulties.

SUMMARY OF THE INVENTION

In the first two embodiments the use of a plastic frame used in the prior art has been eliminated. Common to both assemblies is the use of a shielded receptacle I/O typically of the type B, mentioned in the previous write-up. The frame-less structure was chosen as means to avoid an extra component in the card kit assembly. It will, however, be appreciated that implicit in this concept is the fact that nay axial or torsional forces applied to the card, needs to be withstood directly at the (rivet) connection between PCB and the two end connectors.

In another two embodiment the PCMCIA type II card with the use of side frames or side bars as integral part of the card assembly. Another feature of these embodiments is the "slide-in" of the pre-assembled unit of the PCB with two end receptacle connectors, into a previously formed metal casing (using side frames or bars as holding means) as final assembly step. In this disclosure, the words "side frame" or "side bars" will be inter-changeably used and the differences specified in use. It needs to be mentioned that when the memory card is subjected to mechanical forces (tension pull, twist and flex) in application, these forces need to be withstood without rupture or damage to the delicate (and expensive) electronic assembly. In a frame-less design, the critical force loading areas are the junction of connectors with the PCB, which is often an area of concern for some users. Such conditions may be avoided by use of side frames or side bars as part of the assembly. The concept of "slide-in" of a fully assembled PCB including the two end connectors, gives the user a possibility of properly inspecting and if necessary, repair the module before finalizing the card assembly. These embodiments are adapted to having the final assembly undertaken at the user's premises by virtue of the assembly and the fact that tooling is relatively simple, inexpensive and user-friendly.

BRIEF DESCRIPTION OF THE DRAWINGS

The invention is further described with regard to the accompanying drawings in which:

FIG. 2a is a detailed view of circle II in FIG. 2;

FIG. 2b is an exploded view of the I/O connector element of the memory card shown in FIG. 2;

FIG. 3a is a detailed view of the area within circle III in FIG. 3;

FIG. 3b is an exploded view of the I/O connector shown in FIG. 3;

DETAILED DESCRIPTION OF THE PREFERRED EMBODIMENTS

Figure 1:
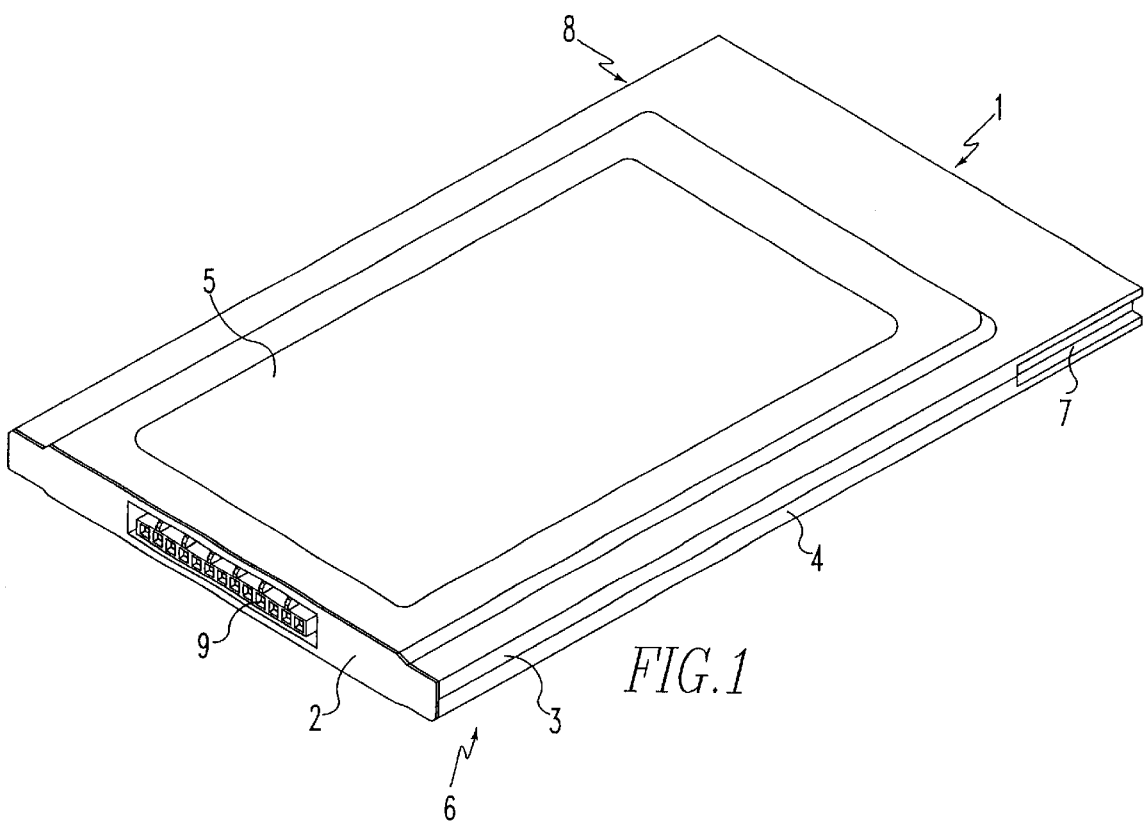
FIG. 1 is a perspective view of a memory card representing preferred embodiment of the present invention.

Referring to FIG. 1, there is shown a 68 position receptacle connector 1 at one end of the card, with another receptacle I/O connector 2 at the other end. The upper and lower shields 5 and 6 in assembled position touch each other along side edges 3 and 4, on two sides of the case. External means (eg. glue, laser or ultrasonics welding) are utilized to finalize the mechanical connection between the two shields. At card side with connector 1, the two corners have the PCMCIA standardized polarizing keys 7 and 8; the purpose being to ensure that the card can only be inserted direction in the (header) card slot of the electronic equipment it needs to connect with. By the same token, the I/O plug (not shown) with cable can only connect to the I/O receptacle 2 also in a specified direction due to upstanding polarizing/ guide keys 9.

Figure 2:
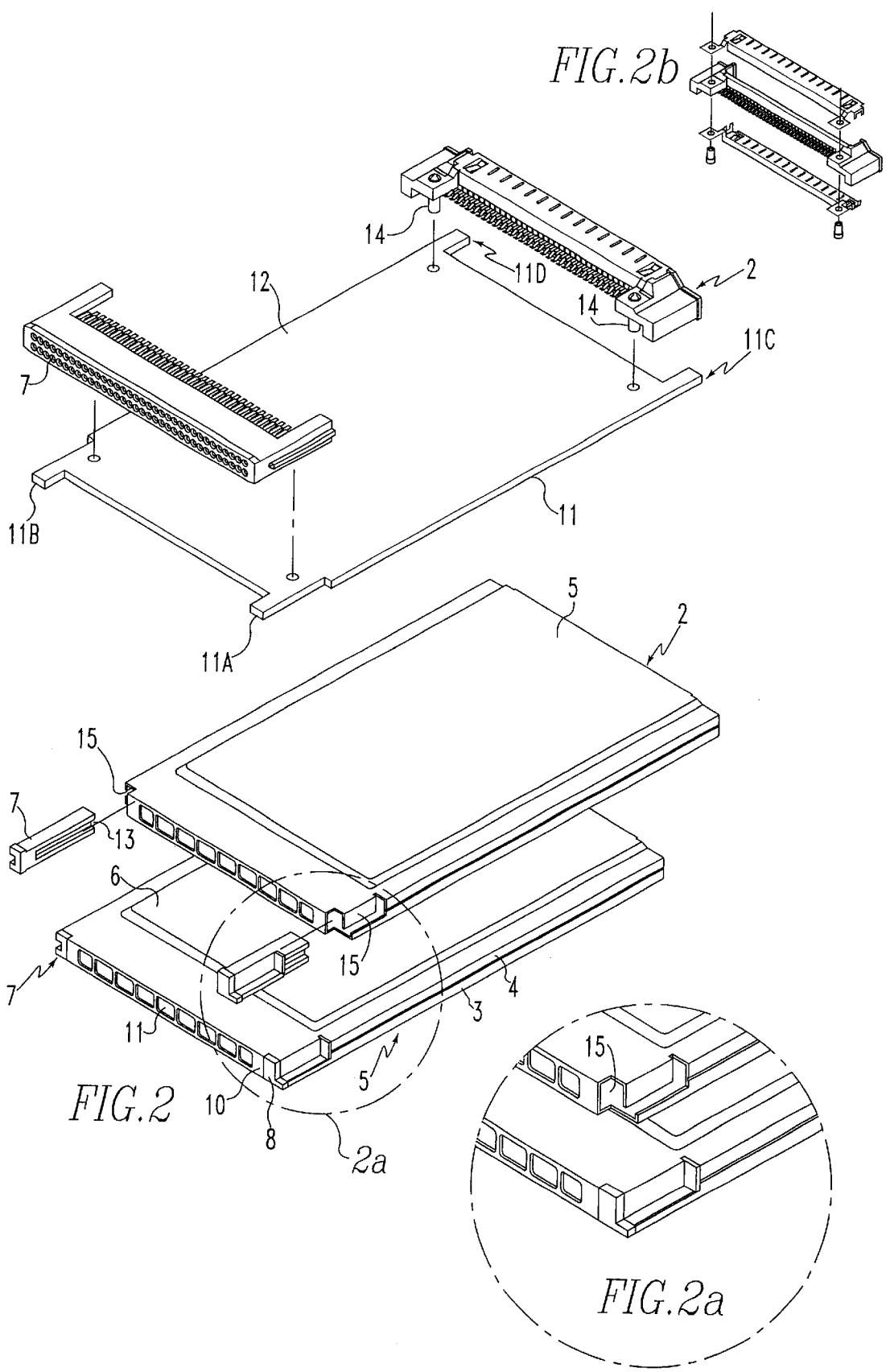
FIG. 2 is an exploded view of the memory card shown in FIG. 1.

FIG. 2 illustrates the general outline of this concept. The two metal shields 5 and 6 are formed from one integral stamping operation, being connected by a metal front 10 with openings 11 to allow entry connecting pins. The 68 position and I/O connector receptacles 1 and 2 are located on a PCB 11 with outwardly projecting tabs 11A/11B/11C and 11D. These tabs act as connector support at two card ends, while preventing connector rocking during card twist and flex. Metal rivets 14 are the means for mechanical fixation between board and connectors. The vias 17 in PCB 11 through which the metal rivets 14 extend are part of a ground track. The 68 position receptacle has on its two ends ridges 12. The polarizing keys 7 and 8 are separate plastic parts with grooves 13 to cooperate with ridges 12. Once the PCB with connector receptacles 1 and 2 and the remaining electronic circuitry is complete, this assembly can be placed into the integral metal card shield stamping (which initially has its I/O ends opened, forming an acute angle with a tax facing metal front 10). Case closure is affected by applying pressure on the shield at the I/O end to allow side edges 3 and 4 to touch each other on both sides of the casing. External means such as glue on ultrasonic welding can be utilized to mechanically joined the upper and lower shields. As a final step, the polarizing keys 7 and 8 can be longitudinally slid into case openings 15 to have its grooves 13 push fit over pre-glued ridges 12 on the ends of the 68 position receptacle connector 1.

Figure 3:
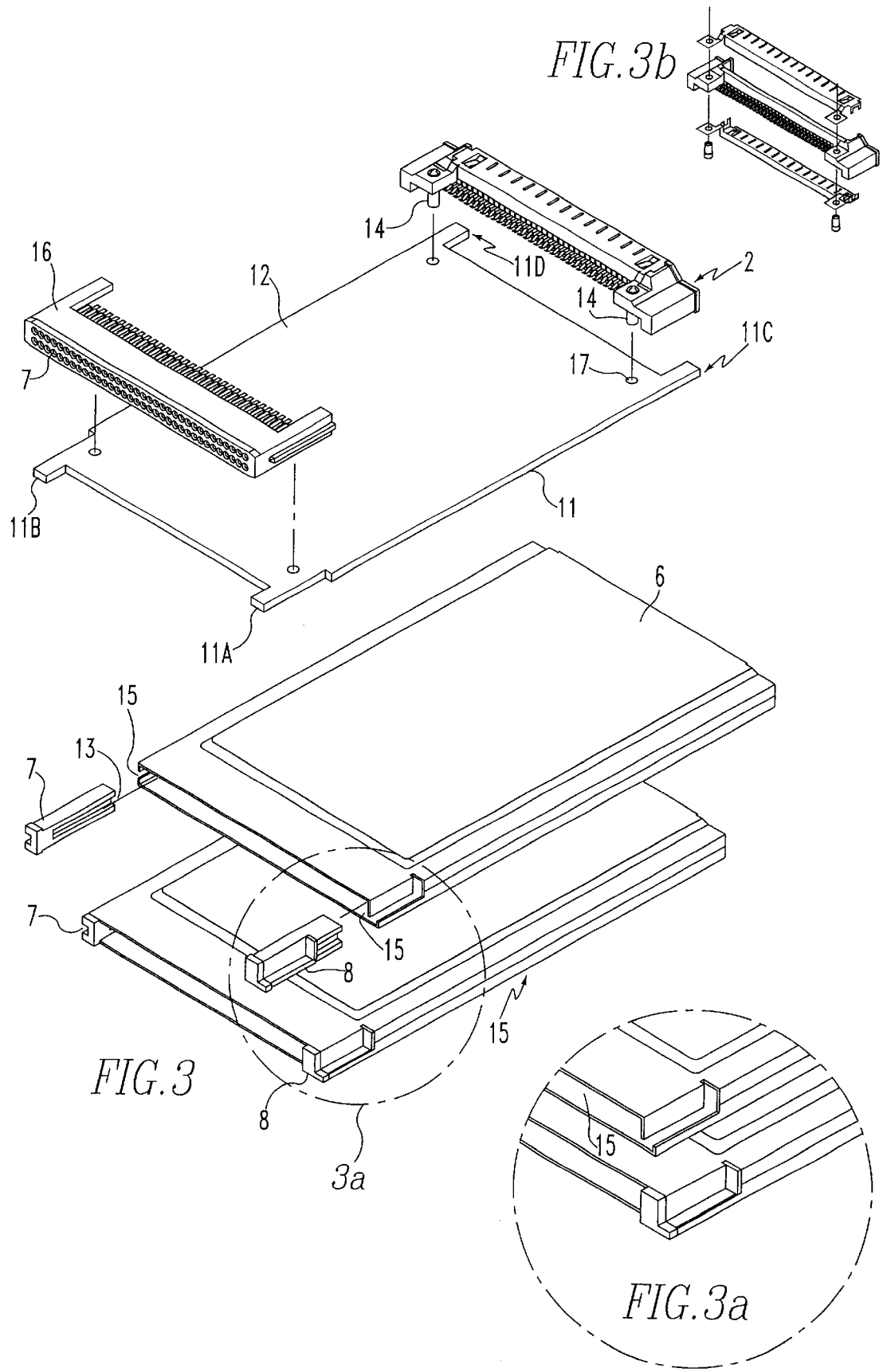
FIG. 3 is an exploded view of another embodiment of the memory card of the present invention.

The elements described in the first embodiment, with the exception that the upper and lower shields are not integrated in one stamping. Instead they are two separate shields. FIG. 3 shows the second embodiment. The remaining description of parts are similar except the 68 pos receptacle connector has a ridge 16 on top and bottom sides to allow the upper and lower shields to "snap" together in final assembly when they are vertically pressed over the PCB assembly. Similar to the first embodiment, the second embodiment employs glue or Laser/Ultrasonic welding is used to mechanically connect the two shields; the separate polarizing keys 7 and 8 fixation.

Figure 4:
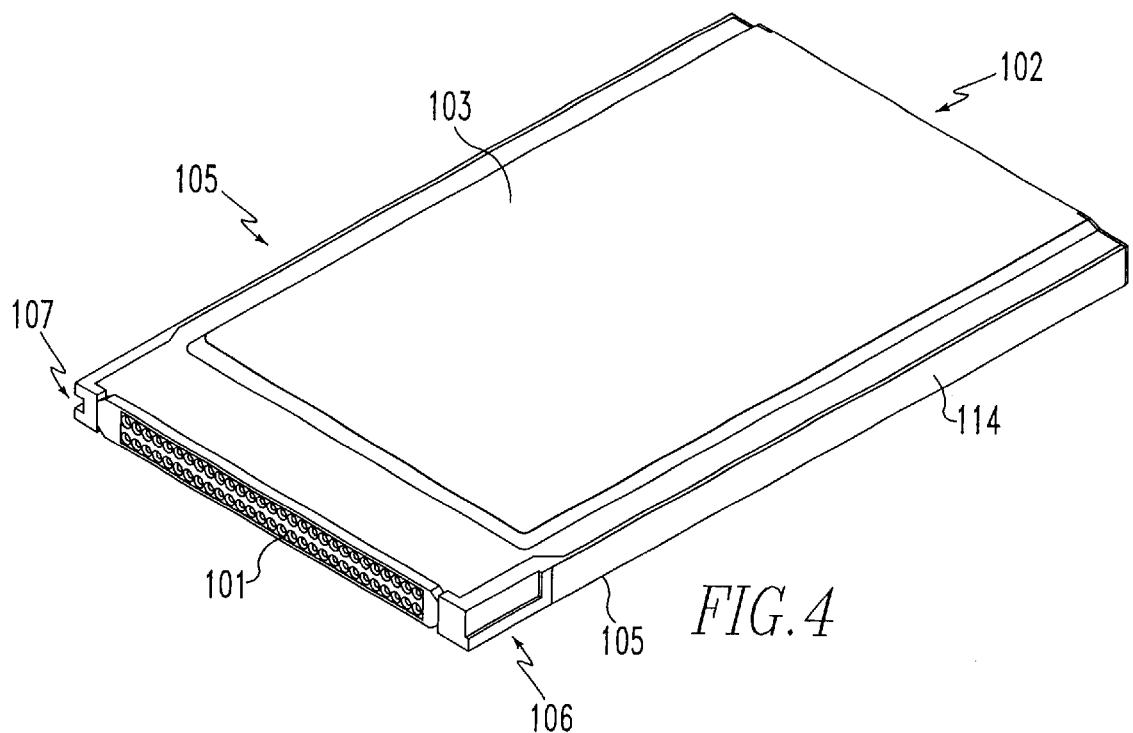
FIG. 4 is a perspective view of a memory card representing another preferred embodiment of the present invention.
Figure 4A:
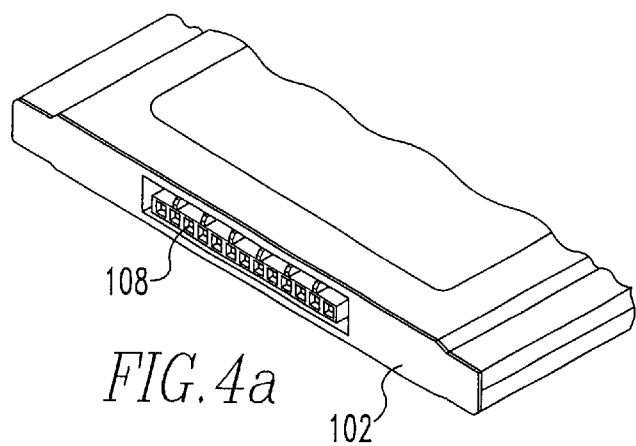
FIG. 4a is a view of the I/O connector of the memory card shown in FIG. 4.

Referring to FIG. 4 an assembled Type II card representing another embodiment is shown with a 68 position receptacle connector 101 at one end of the card, with another receptacle I/O connector 102 at the other end. The upper and lower shields 103 and 104 are attached on the two casings sides to the frame or side bars 105 and 105' by mechanical fixation, to be discussed later. The front end of the card (68 position receptacle 102) has the specified polarizing keys (106 and 107) to ensure that the card may be inserted only in one direction into the PCMCIA slot (not shown) of the equipment it needs to fit. In a similar fashion, the upstanding polarizing/guide key 108 on the I/O receptacle connector 102 ensures that the I/O plug connector with cable (not shown) fits the card only in one direction.

Figure 5:
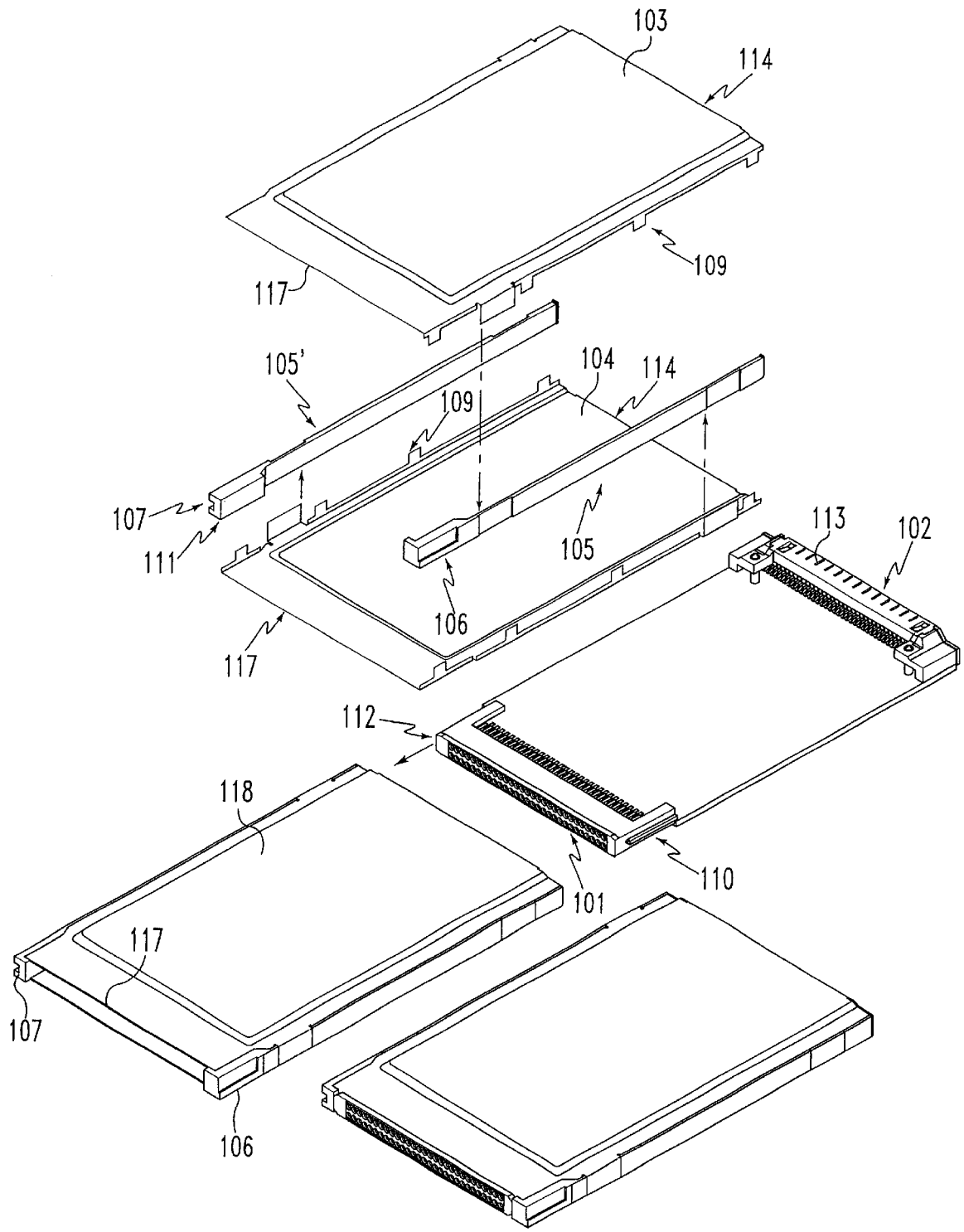
FIG. 5 is a exploded perspective view of a memory card representing another preferred embodiment of the present invention.
Figure 6A:
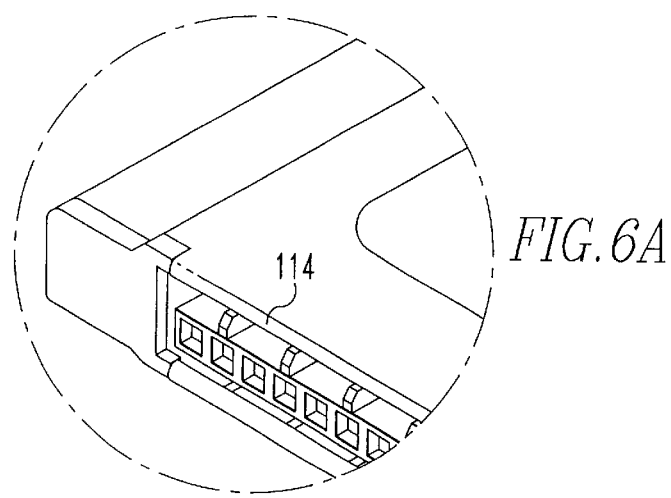
FIG. 6a is a detailed view of the area within circle VI in FIG. 6.
Figure 6:
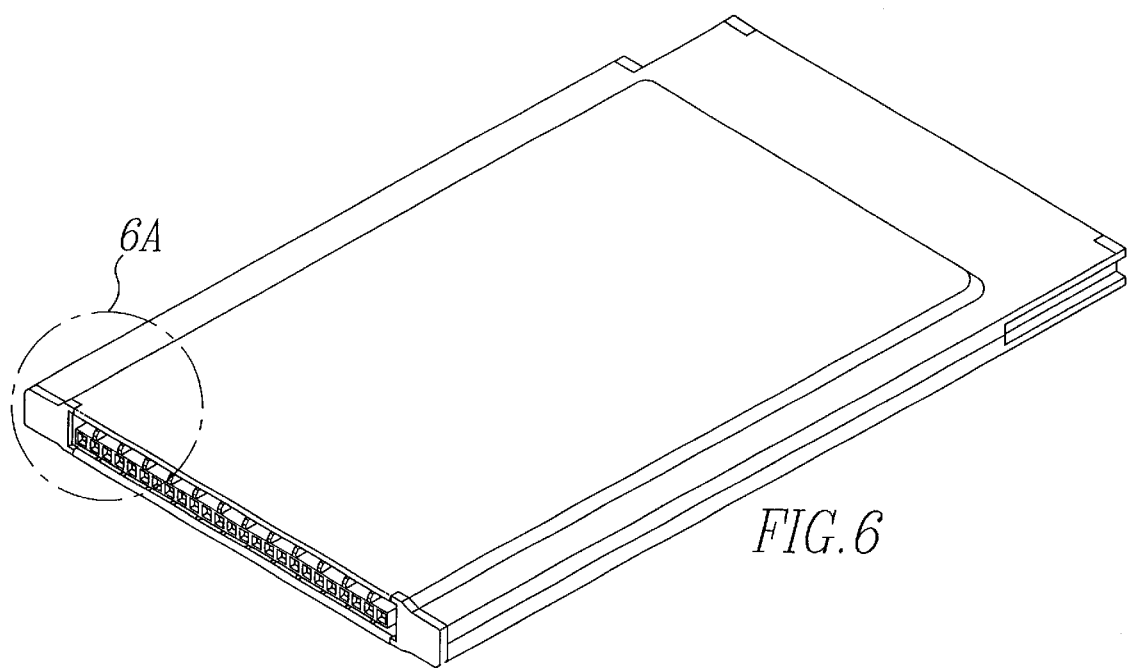
FIG. 6 is a perspective view from the I/O connector side of a memory card representing another preferred embodiment of the present invention.
Figure 6B:
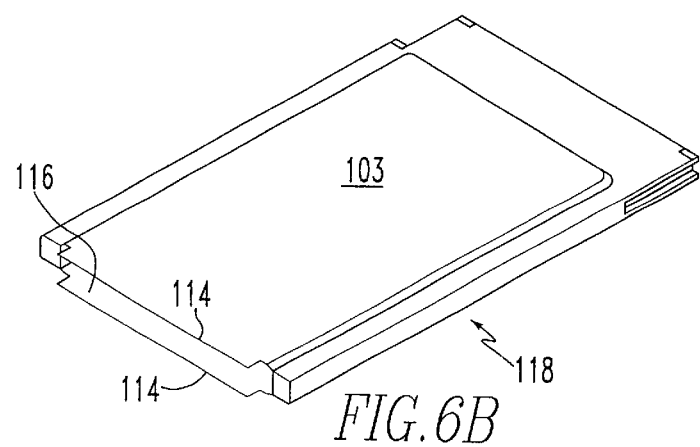
FIG. 6b is a perspective view of the shield element of the memory card shown in FIG. 6.
Figure 7A:
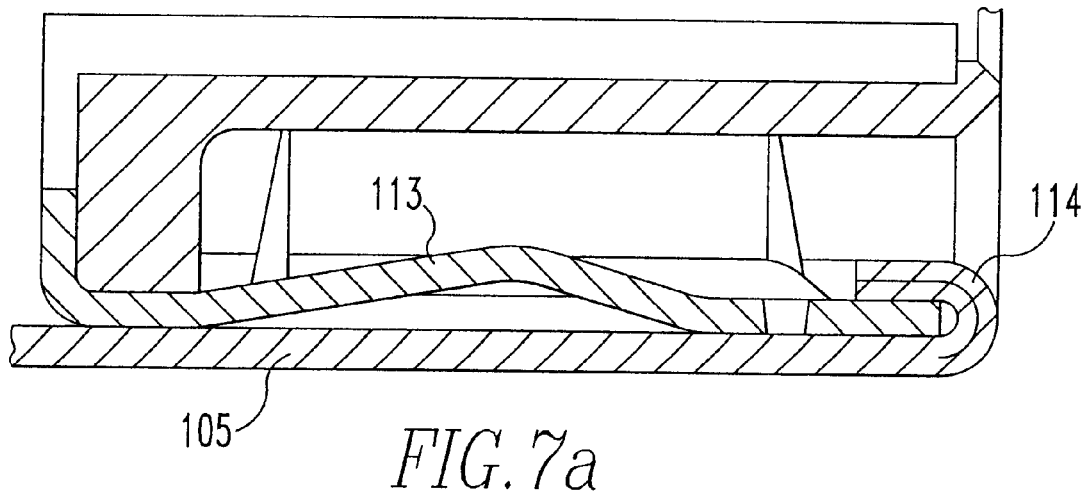
FIGS. 7a–7c are cross sectional schematic illustrations showing the engagement of the frame and shields as is described in greater detail hereafter.
Figure 7B:
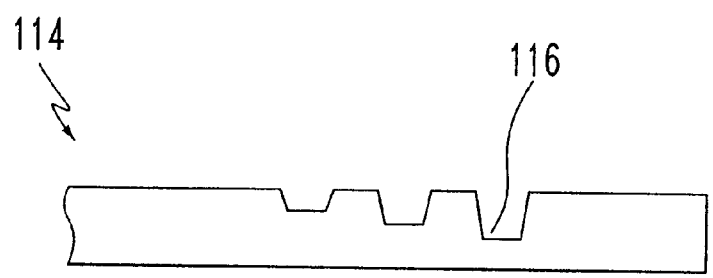
Figure 7C:
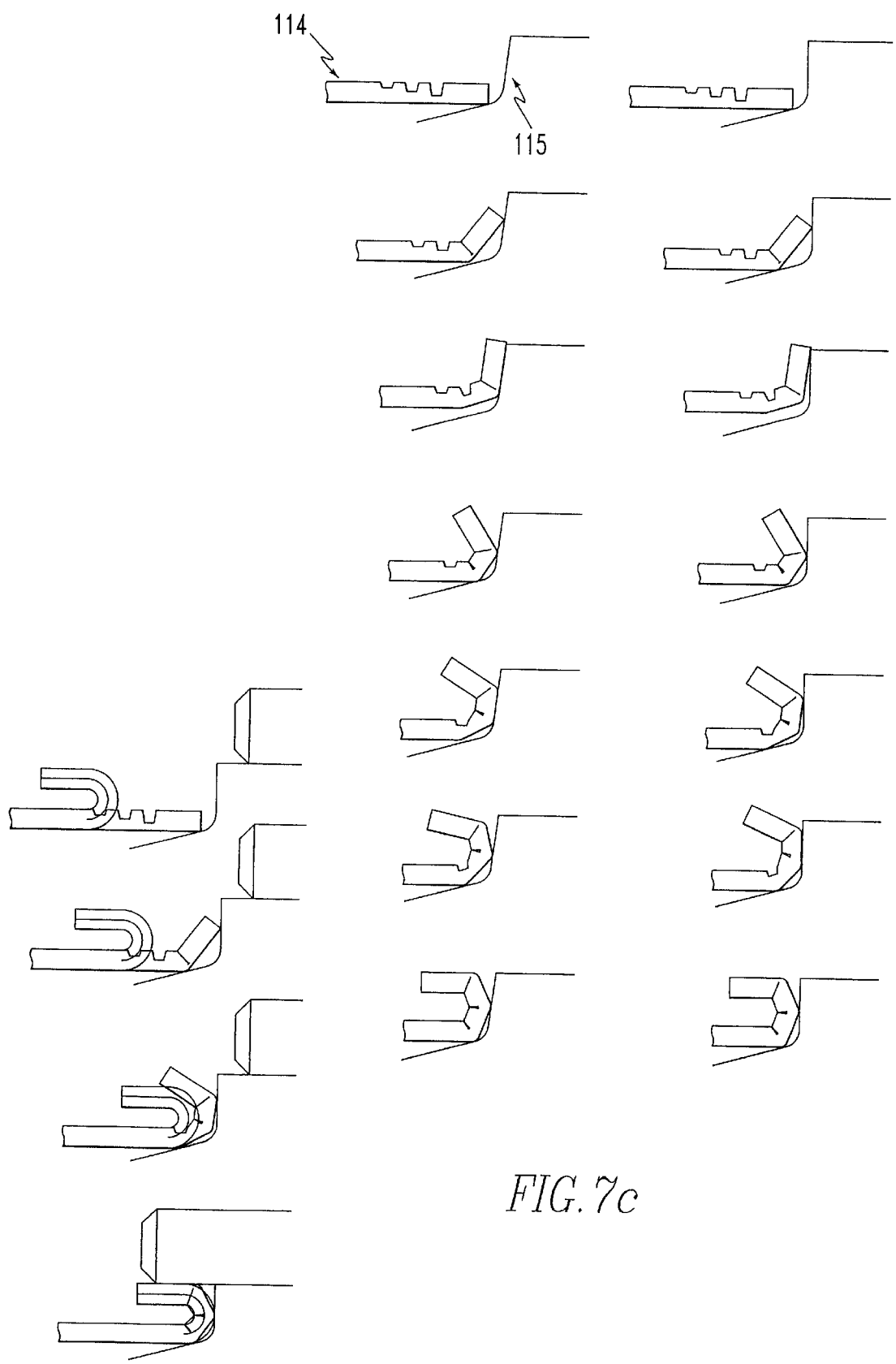
Figure 8A:
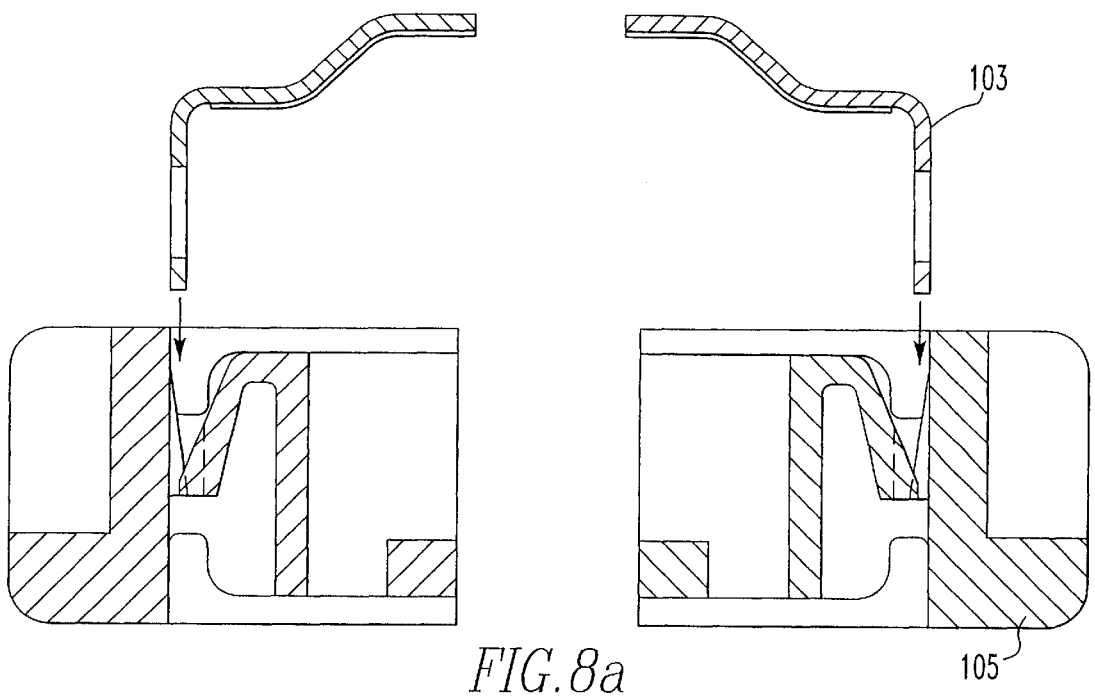
FIGS. 8a–8c are other schematic illustrations showing the engagement of the frame and the shield.
Figure 8B:
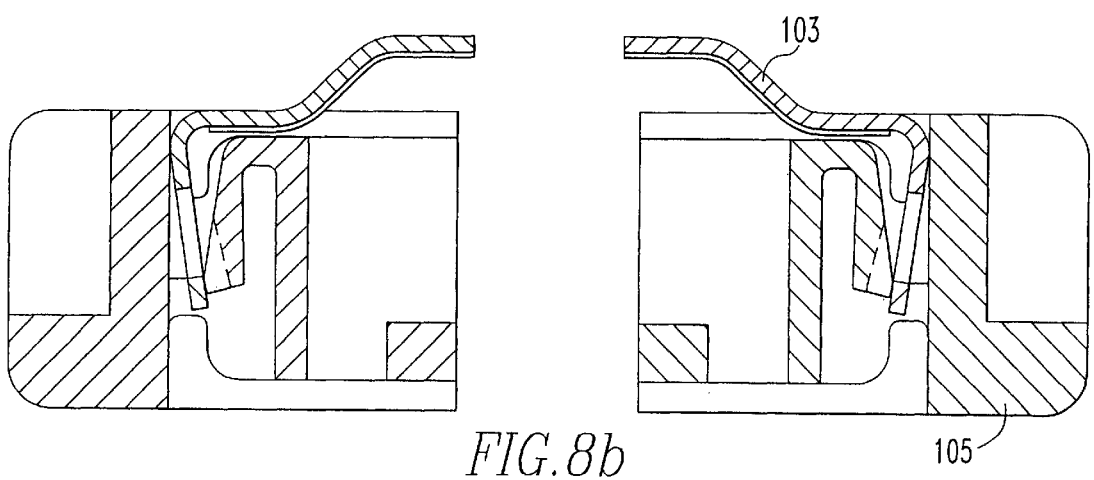
Figure 8C:
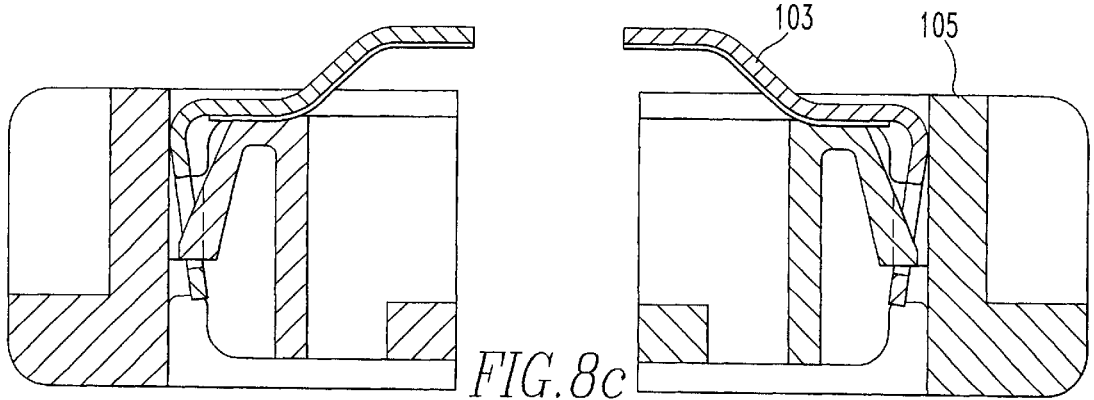

As shown in FIG. 5, the upper and lower metal shields 103 and 104 with rear edges 114 and front edges 117, have on its sides several upstanding hold-down 109. Two plastic side frames 105 and 105' are located to be interposed between the two shields. These frames have appropriately located recesses (not visible) to cooperate with the hold-down's to permit fixation to form an integral outer casing 118 shown in FIG. 6. This feature consists of side stubs perpendicular to shield surface with a rectangular opening; when the shield is pushed towards the frame, a plastic latch from the frame engage in the window in opposing stubs. A further embodiment of the casing rear edge 114 shown in FIG. 6 is that on the inside surface of the upper and lower shields (facing the PCB), are knurls 116 over case width as evident from cross-section detail of FIG. 7. The PCB assembly can be prepared as a module shown in the middle right side of FIG. 5, with a separate blow-up in FIG. 8. The I/O receptacle connector 102 with metal shields 113 has been described elsewhere.

Figure 9:
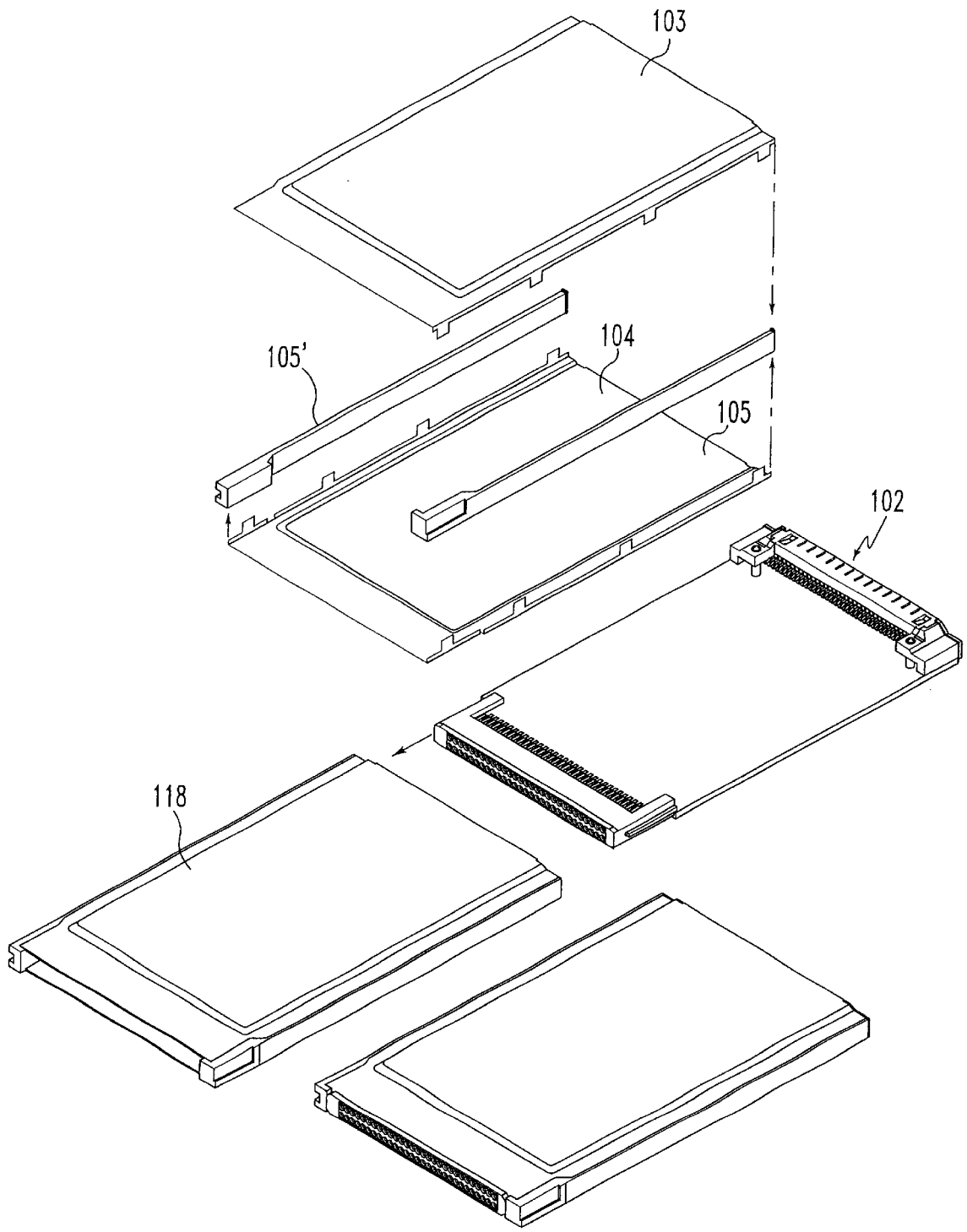
FIG. 9 is a exploded perspective view of another preferred embodiment of the memory card of the present invention.
Figure 10:
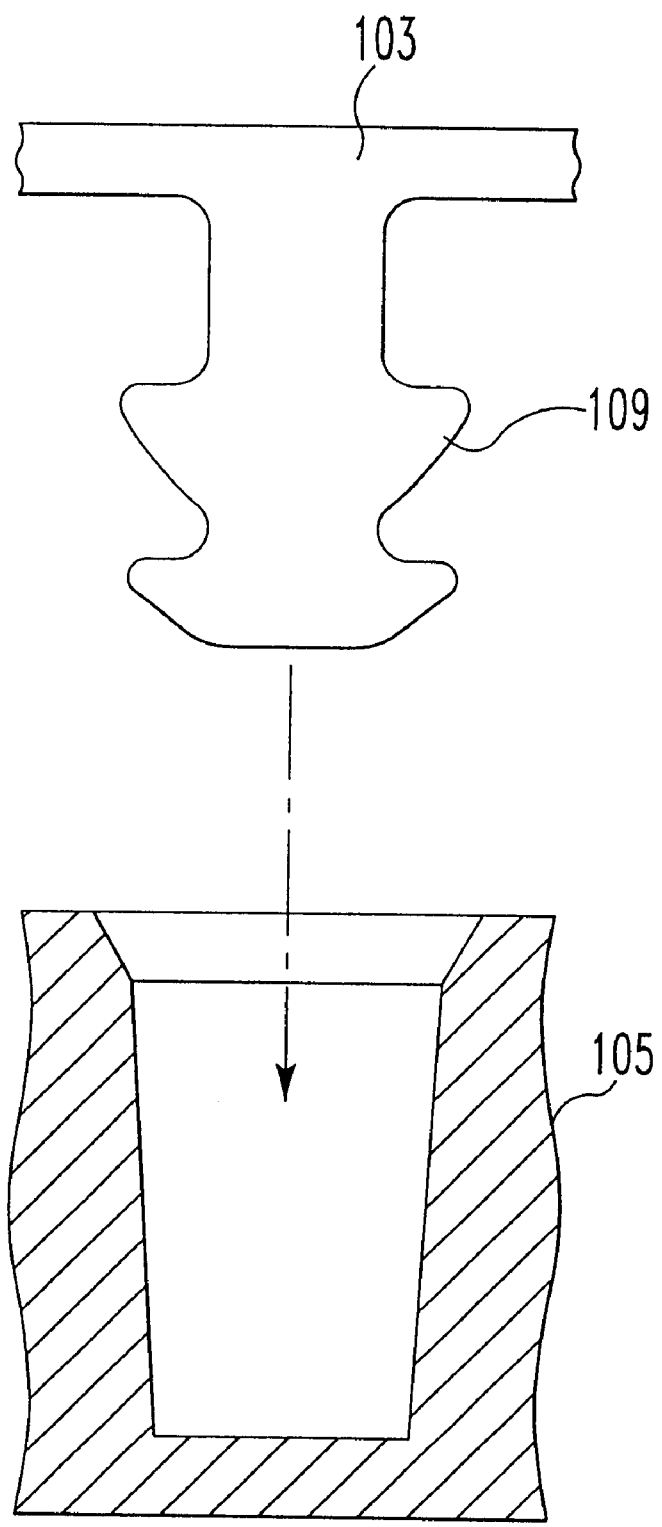
FIG. 10 is a detailed view of the latching mechanism used in the memory card shown in FIG. 9.

The 68 position receptacle connector 101 has a raised ridge 112 over the top and bottom along a substantial length of the connector, to cooperate with the shield front edge 117 as additional "snap-on" connection in the final assembled condition. Further, receptacle connector 101 has protrusions 110 at its two ends, which fit the grooves 111 on the inner facing side of the frame as shown in the middle of FIG. 5. The PCMCIA polarizing keys 106 and 107 are integrated with the frame outer side. The PCB assembly can be slide-in from the side of the rear edge 114 of the integrated outer casing 118 until the area of front edge 117 of the shields are spring-loaded pushed over the raised ridge 112 of the 68 position receptacle connector 101, in a snap-fit connection. In this condition, the rear edge 114 with knurls 116 on the inside surface, extends slightly beyond the 110 receptacle connector 102 end face of the PCB assembly. As demonstrated in the right hand side of FIG. 7, this extension portion of rear edge 114 can be laid against an anvil 115, a nd th is area can be easily curled over and press against the shield 113 of the I/O receptacle connector 102. Since the connector shield 113 engages the card shields 103,104, and the connector shield 113 engages a ground track on the PCB 11 through metal rivets 14, card shields 103, 104 are electrically connected to the ground track on the PCB 11, forming a ground loop. This process is easy to conduct at the user's premises, and results together not only with a "snap-on" of shield front edge 117 on raised ridge 112 of 68 position receptacle connector 101, but also in an longitudinal locking of the PCB assembly within the integrated outer casing. This longitudinal locking with clamping of the shields to the assembly in the vertical direction, implies that the card assembly can withstand the vigor of twisting, flex and accidental cable pull from the plug 10. It is to be noted in this design that the strength of the assembly is to a large extent defined by the hold-down strength of the connection between the plastic latch from frame cooperating with the window in the metal stub extending from shield, as evident from FIG. 8. Increasing the number of hold-down location contributes further to the mechanical integrity of the case. However, an increase in the number of positions may weaken the overall mechanical strength of the plastic frame. Nevertheless, it is possible to use additional glue along the sides of the upper and lower shields to increase hold-down surface to frame, to assist in the fixation but this means an additional process step. But this means an additional process step. Further, plastic side frame material is "transparent" for EMI application environment. Hence, although this design is considered useful in a certain application environment, the need for another concept is desirable for more sophisticated users requiring enhanced robustness and EMI shield possibility. This design is shown in FIG. 9. The major difference from the design in FIG. 6 is the use of metal die-cast side bars, and a more rugged hold-down 109 device as part of the upper and lower shields. These die-cast side bars are in essence similar to the plastic side frame in previous design, but the cavities to receive the hold-down's are different. FIG. 10 shows this Christmas tree, e.g. type, a vertical hold-down latch with lateral projections of increasingly shorter length toward the terminal end with opposing cavity in die-cast side bars. The metal die-cast side bars are, in addition act as an EMI shield along the side surface of the PCMCIA card. Conventionally, zinc alloy die-cast material is used in connector shielding applications. Other alternatives being aluminum or magnesium compounds. Zinc and aluminum alloys lack mechanical strength and the stress-bearing capability desirable of press-fit connections; aluminum has a somewhat lower EMI shielding capability. For this reason, the choice to use magnesium alloy for die-cast, is the preferred option. Magnesium alloy is light-weight, and die-casting of intricate shapes and thin walls, resembles plastic's use. Consequently this magnesium alloy is the preferred material for the side bars.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. In a PC card comprising a printed circuit board (PCB) assembly interposed between card shields, wherein the improvement comprises a polarizing key located adjacent said PCB assembly, and outwardly projecting tabs on the PCB support (the receptacle connector) to make the PC card more rigid.

2. The card of claim 1 wherein a metal case is applied over a pre-assembled PCB.

3. The card of claim 1 wherein said card includes a connector.

4. The card of claim 1 wherein the metal shields are connected by a laser weld.

5. The card of claim 1 wherein the metal shields are connected by an ultrasonic weld.

6. The card of claim 1 wherein the metal shields are connected by an adhesive.

7. A PC card comprising a printed circuit board (PCB) assembly interposed between card shields having two interposing plastic side frames, wherein there are ground tracks on the PCB, the shields are electrically connected to said ground tracks to form a ground loop, the shields have a hold-down area with a window, and the plastic side frame latches to said window.

8. The card of claim 7 wherein the side frames have polarizing features.

9. A PC card comprising a printed circuit board (PCB) assembly interposed between card shields having two interposing metallic side frames, wherein there are ground tracks on the PCB and the shields are electrically connected to said ground tracks to form a ground loop.

10. The card of claim 9 wherein the shields are press fit to the side frames by latches having lateral protrusions.

11. The card of claim 10 wherein the lateral protrusions decrease in length toward the terminal end of the protrusions.

12. A PC card comprising a printed circuit board (PCB) assembly interposed between card shields having two interposing side frames and including a connector with an outwardly projecting ridge, wherein there are ground tracks on the PCB and the shields are electrically connected to said ground tracks to form a ground loop.

13. The card of claim 12 wherein the ridge engages one of the shields.

14. A PC card comprising a printed circuit board (PCB) assembly interposed between card shields having two interposing side frames, wherein said side frames minimize relative movements of the PCB and the shields, the PCB has ground tracks, and the shields are electrically connected to said ground tracks to form a ground loop.

15. A PC card comprising a printed circuit board (PCB) assembly interposed between card shields having two interposing side frames that slidably engage the shields, wherein there are ground tracks on the PCB and the shields are electrically connected to said ground tracks to form a ground loop.

16. A PC card comprising a printed circuit board (PCB) assembly interposed between card shields having two interposing side frames, wherein the connector has an outwardly projecting ridge.

17. A PC card, comprising:
    a printed circuit board;
    at least one electrical connector mounted to said printed circuit board;
    a conductive shield surrounding said printed circuit board and said connector, said shield having sides; and
    a frame consisting essentially of a pair of bars, each extending along a respective one of said sides of said shield.

18. The PC card as recited in claim 17, wherein said pair of bars secure to said shield.

19. The PC card as recited in claim 17, wherein said shield is two-piece.

20. The PC card as recited in claim 17, wherein said at least one electrical connector comprises two electrical connectors located on opposite ends of said printed circuit board.

21. The PC card as recited in claim 17, wherein said bars are discrete.

* * * * *